*(12)* United States Patent
Wang et al.

(10) Patent No.: US 8,629,728 B2
(45) Date of Patent: Jan. 14, 2014

(54) VCO CONTROL CIRCUIT AND METHOD THEREOF, FAST LOCKING PLL AND METHOD FOR FAST LOCKING PLL

(75) Inventors: Yao-Chi Wang, Hsinchu Hsien (TW); Ming-Yu Hsieh, Hsinchu Hsien (TW); Shih-Chieh Yen, Hsinchu Hsien (TW)

(73) Assignee: MStar Semiconductor, Inc. (TW)

( * ) Notice: Subject to any disclaimer, the term of this patent is extended or adjusted under 35 U.S.C. 154(b) by 82 days.

(21) Appl. No.: 12/886,112

(22) Filed: Sep. 20, 2010

(65) Prior Publication Data

US 2011/0080196 A1    Apr. 7, 2011

(30) Foreign Application Priority Data

Oct. 2, 2009    (TW) ................................ 98133526 A (51) Int. Cl.
  *H03L 7/00*    (2006.01)
(52) U.S. Cl.
  USPC .......... 331/16; 331/17; 331/36 C; 331/177 R; 331/179; 331/177 V; 375/376
(58) Field of Classification Search
  USPC ............ 331/16, 17, 36 C, 177 R, 179, 177 V; 375/376
  See application file for complete search history.

(56) References Cited

U.S. PATENT DOCUMENTS

| 6,496,075 B2* | 12/2002 | Justice et al. .................... 331/11 |
| 6,927,637 B1* | 8/2005 | Koh et al. ........................ 331/17 |
| 6,952,124 B2* | 10/2005 | Pham ............................. 327/156 |
| 7,180,375 B2* | 2/2007 | Maeda et al. ................. 331/1 A |
| 7,301,406 B2* | 11/2007 | Bang et al. ...................... 331/16 |
| 7,471,158 B2* | 12/2008 | Han et al. ........................ 331/17 |
| 7,940,129 B1* | 5/2011 | Tsang et al. .................... 331/17 |
| 2007/0121774 A1* | 5/2007 | Lee et al. ....................... 375/376 |
| 2008/0129402 A1* | 6/2008 | Han et al. ....................... 331/179 |

* cited by examiner

*Primary Examiner* — Arnold Kinkead
*Assistant Examiner* — Richard Tan (57) ABSTRACT

A voltage-controlled oscillator (VCO) control circuit, used for controlling a VCO to process phase locking procedure after receiving a frequency locking signal, comprises an operating frequency controller and a judgment unit. The operating frequency controller, coupled to the VCO and the judgment unit, generates one of a first control code and a second control code to the VCO. The judgment unit, coupled to an input end of the VCO, generates a phase locking signal according to a voltage control signal inputted to the VCO. When the operating frequency controller receives the frequency locking signal, the operating frequency controller generates a first control code to control the VCO to switch from a first candidate VCO curve to a second candidate VCO curve. When the operating frequency controller receives the phase locking signal, the operating frequency controller generates a second control code to control the VCO to switch from the second candidate VCO curve to the first candidate VCO curve.

14 Claims, 9 Drawing Sheets

VCO CONTROL CIRCUIT AND METHOD THEREOF, FAST LOCKING PLL AND METHOD FOR FAST LOCKING PLL

CROSS REFERENCE TO RELATED PATENT APPLICATIONS

This patent application claims priority from Taiwan Patent Application No. 098133526, filed in the Taiwan Patent Office on Oct. 2, 2009, entitled "VCO Control Circuit and Method Thereof, Fast Locking PLL and Method for Fast Locking PLL", and incorporates the Taiwan patent application in its entirety by reference.

TECHNICAL FIELD

The present disclosure relates to a phase locked loop (PLL), and more particularly, to a voltage-controlled oscillator (VCO) control circuit and control method thereof, a fast locking PLL and a method for fast locking a PLL.

BACKGROUND OF THE PRESENT DISCLOSURE

In Global System for Mobile Communications (GSM) system, packets are alternately transmitted and received in different frequencies, i.e., after GSM system transmits a packet via a first frequency, a PLL is used to generate a second frequency for receiving another packet. In GSM standard, only a short period of approximately 300 μs is available for switching between transmitting. Therefore the PLL must to complete switching the clock signal from the first frequency to the second frequency or from the second frequency to the first frequency in the short period.

Figure 1:
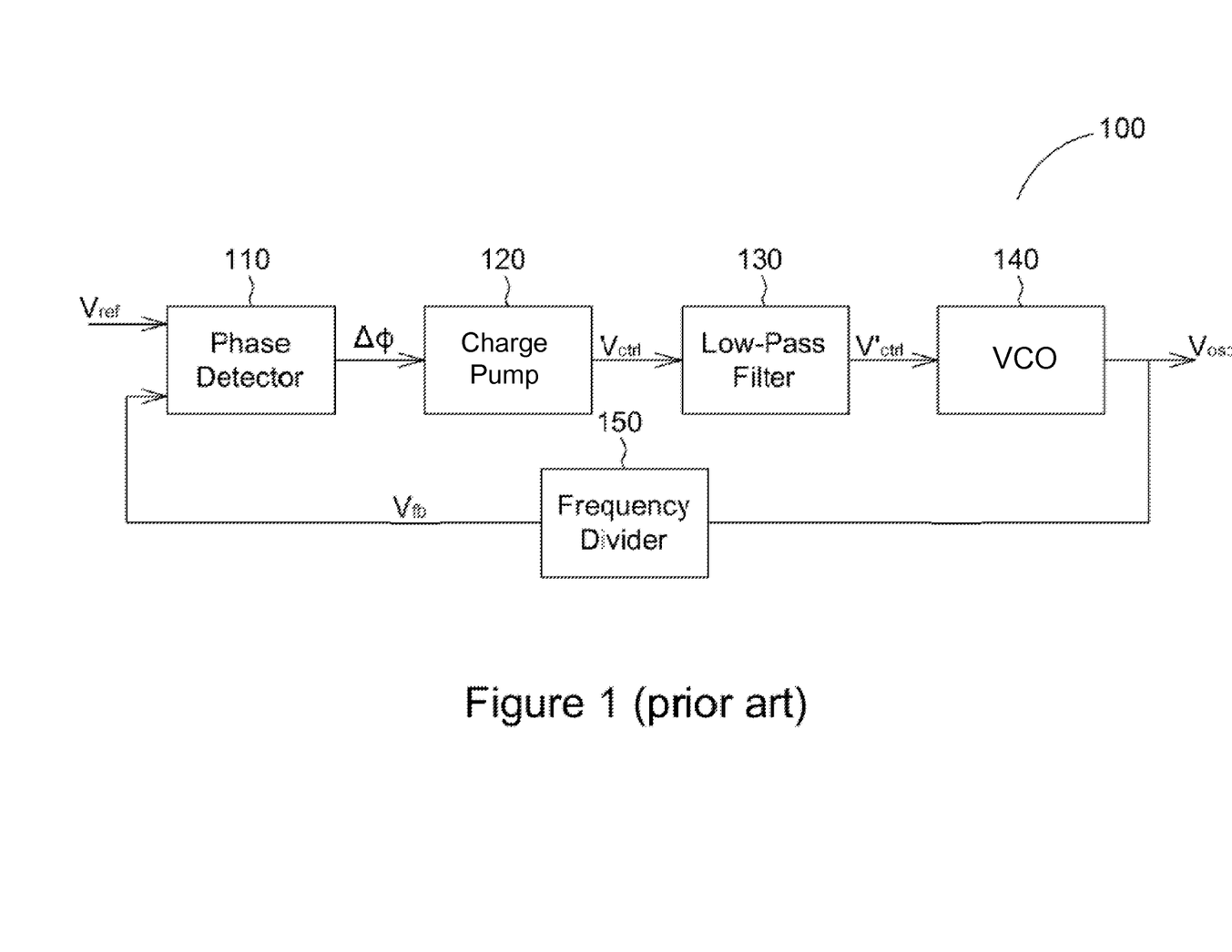
FIG. 1 is a block diagram of a conventional PLL.

FIG. 1 shows a block diagram of a conventional PLL 100 comprising a phase detector 110, a charge pump 120, a low-pass filter 130, a VCO 140 and a frequency divider 150. Operations of the PLL 100 are to be described below. The phase detector 110 detects a phase difference between a reference signal $V_{ref}$ and a feedback signal $V_{fb}$ to generate a phase difference signal ψ. The charge pump 120 generates a control voltage $V_{ctrl}$ according to the phase difference signal LP. The low-pass filterer 130 low-pass filters the control voltage $V_{ctrl}$ to generate a filtered control voltage $V'_{ctrl}$. The VCO 140 generates an output voltage $V_{osc}$ according to a voltage level of the filtered control voltage $V'_{ctrl}$. The frequency divider 150 frequency divides the output signal $V_{osc}$ to generate the feedback signal $V_{fb}$.

Figure 2:
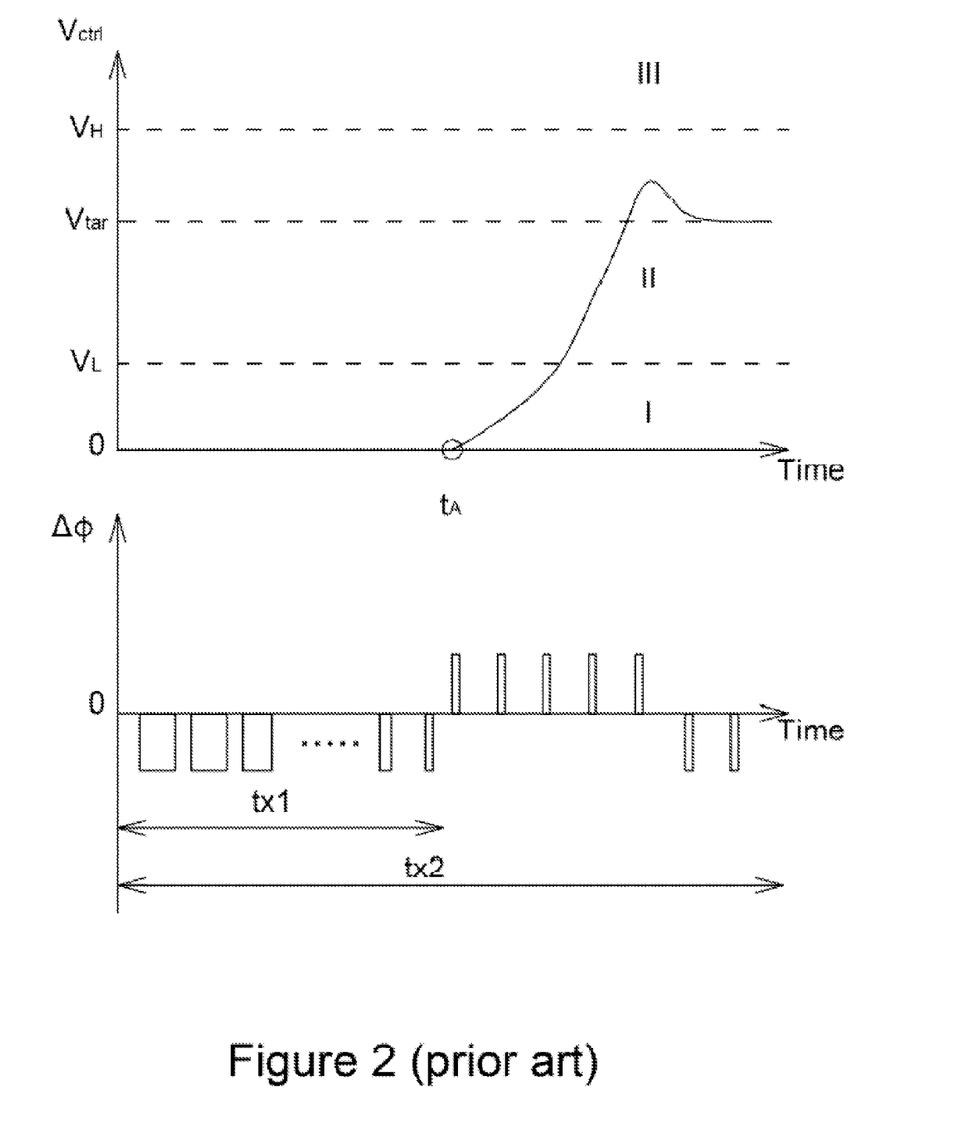
FIG. 2 is a schematic diagram of an example of operations of a conventional PLL.

FIG. 2 shows a schematic diagram of an example of operations of the PLL 100. When a VCO curve of the VCO 140 is determined (i.e., a frequency of the feedback signal $V_{fb}$ is equal to or approximates to the frequency of the reference signal $V_{ref}$), and the phase of the reference voltage $V_{ref}$ in FIG. 1 lags the phase of the feedback signal $V_{fb}$, the control voltage $V_{ctrl}$ generated by the charge pump 120 according to the phase difference signal Δψ approximates 0V. That is, the VCO 140 decreases the frequency of the output signal $V_{osc}$ to gradually narrow down the phase difference between the feedback signal $V_{fb}$ and the reference signal $V_{ref}$ until the phase of the feedback signal $V_{fb}$ leads the phase of the reference signal $V_{ref}$ (e.g., at a transition time point $t_A$ in FIG. 2), and at this point, the control voltage $V_{ctrl}$ gradually rises until it approximates to a target voltage level $V_{tar}$.

For example, supposing that a gain $K_{VCO}$, of the VCO curve of the VCO 140 is 10 MHz/Volt, and a divisor of the frequency divider 50 is 300, the frequency of the output signal $V_{osc}$ is 3.6 GHz, and an initial voltage of the control voltage $V_{ctrl}$ is 1V when the frequency of the reference voltage $V_{ref}$ is 12 MHz. When the phase of the reference voltage $V_{ref}$ is 360 degrees lag to the phase of the feedback signal, the control voltage $V_{ctrl}$ is decreased from 1V to 0V and outputted, and the frequency of the output signal is decreased from 3.6 GHz to 3.59 GHz, such that a time needed for the phase of the reference voltage $V_{ref}$ to reach the phase of the feedback signal $V_{fb}$ (e.g., at time points t=0 to t=$t_A$) is N cycles of the reference voltage $V_{ref}$ or N−1 cycles of the feedback signal $V_{fb}$, i.e., N*(1/12 MHz)=(N−1)*(300/3590 MHz), where N is equal to 360. When the phase of the reference voltage $V_{ref}$ is M degrees lag to the phase of the feedback signal, the time needed for the phase of the reference voltage $V_{ref}$ to reach the phase of the feedback signal $V_{fb}$ is calculated as tx1=(M/360 degree)*360*(1/12 MHz)=(M/360 degree)*30 μs. Therefore, when the phase of the reference voltage $V_{ref}$ about 360 degrees lags the phase of the feedback signal $V_{fb}$, the time period tx1 for the phase of the reference voltage $V_{ref}$ to reach the phase of the feedback signal $V_{fb}$ is about 30 μs.

As mentioned above, there is only 300 μs available to switch between transmitting and receiving in the GSM system. In the period, and the transceiver need to calibrate a direct current (DC) offset and stabilize the PLL circuit. Generally speaking, the PLL 100 only has 150 μs to 170 μs for adjusting the phase of the feedback signal $V_{fb}$ to equal the phase of the reference signal $V_{ref}$. However, in the foregoing example, If the phase difference between the reference voltage $V_{ref}$ and the feedback signal $V_{fb}$ approximates 360 degree, the PLL 100 requires the time period tx1 approximating to 30 μs for adjusting the phase of the reference voltage $V_{ref}$ to reach the phase of the feedback signal $V_{fb}$. In addition, the PLL 100 still needs a significant amount of time to converge the voltage level of the control voltage $V_{ctrl}$ (or the filtered control voltage $V'_{ctrl}$) since accuracy of output signal $V_{osc}$ compliant to the GSM specification needs to be less than 0.1 ppm. That is, a time period between the time point $t_A$ and a time point at which the locking process ends is quite long, such that the GSM specification may not be fulfilled for that a locking time of the PLL 100 is too long. Accordingly, the rather-long locking time results in an increase in power consumption as well as a decrease in time allowed for calibrations of other components, e.g., a calibration time for DC offset.

In addition, the conventional method for reducing the time period tx1 is shown in FIG. 2; however, the method mentioned in this article is only applicable to a situation where the phase difference between the reference voltage $V_{ref}$ and the feedback signal $V_{fb}$ is within 180 degrees to 360 degrees. Therefore, the method in the article cannot significantly or comprehensively reduce the locking time of the PLL 100.

SUMMARY OF THE PRESENT DISCLOSURE

An object of the present disclosure is to provide a VCO control circuit and method thereof, a fast locking PLL, and a method for fast locking a PLL to solve the foregoing problems.

According to an embodiment of the present disclosure, a voltage-controlled oscillator (VCO) control circuit, applied to a phase locked loop (PLL), for controlling a VCO to process phase locking procedure after receiving a frequency locking signal. The circuit comprises an operating frequency controller and a judgment unit. The operating frequency controller, coupled to the VCO and the judgment unit, for generating one of a first control code and a second control code to the VCO. The judgment unit, coupled to an input end of the VCO, for generating a phase locking signal according to a voltage control signal inputted to the VCO. When the operating frequency controller receives the frequency locking signal, the operating frequency controller generates a first control code to control the VCO to switch from a first candidate VCO curve to a second candidate VCO curve, and when the operating frequency controller receives the phase locking signal, the operating frequency controller generates a second control code to control the VCO to switch from the second candidate VCO curve to the first candidate VCO curve.

According to another embodiment of the present disclosure, A fast locking phase locked loop (PLL) circuit is used for accelerating convergence of a phase when a frequency is locked. The fast locking PLL comprises a detector, a filter, a VCO, a frequency divider and a VCO control circuit. The detector generates a voltage control signal according to a phase difference between a reference signal and a feedback signal. The filter, coupled to the detector, filters the voltage control signal to generate a filtered voltage control signal. The VCO, coupled to the filter and the VCO, generates one of a first control code and a second control code to the VCO. The frequency divider, coupled to the VCO and the detector, generates the feedback signal according to the output signal. The VCO control circuit, coupled to the filter and the VCO, generates one of a first control code and a second control code to the VCO. Wherein, when the VCO control circuit receives a frequency locking signal, the VCO control circuit generates a first control code to control the VCO to switch from a first candidate VCO curve to a second candidate VCO curve, and when VCO control circuit determine that the filtered voltage control signal is greater than a first threshold, the operating frequency controller generates a second control code to control the VCO to switch from the second candidate VCO curve to the first candidate VCO curve.

According to yet another embodiment of the present disclosure, a voltage-controlled oscillator (VCO) control method, applied to a phase locked loop (PLL), is used for controlling a VCO to process phase locking procedure after receiving a frequency locking signal. The VCO control method comprises that generating a first control code to control the VCO to switch from a first candidate VCO curve to a second candidate VCO curve when the frequency locking signal is received and generating a second control code control the VCO to switch from the second candidate VCO curve to the first candidate VCO curve when a voltage control signal inputted by the VCO is larger than a first threshold.

DETAILED DESCRIPTION OF THE PREFERRED EMBODIMENT

Figure 3:
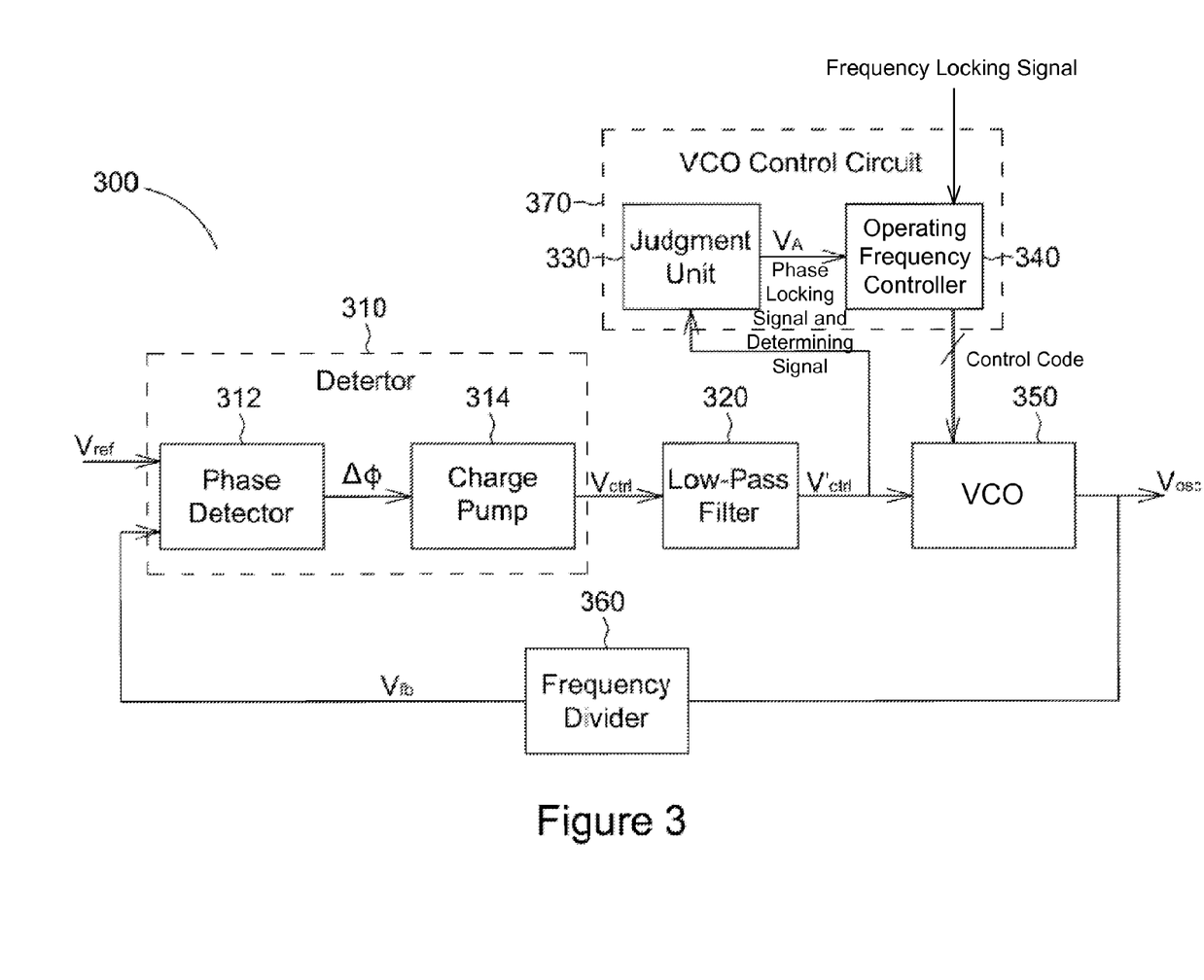
FIG. 3 is a schematic diagram of a PLL in accordance with an embodiment of the present disclosure.

FIG. 3 shows a block diagram of a PLL 300 in accordance with an embodiment of the present disclosure. The PLL 300 comprises a detector 310, a low-pass filter 320, a VCO control circuit 370 for controlling an oscillator (e.g., a VCO 350 in this embodiment), and a frequency divider 360. The detector 310 comprises a phase detector 312 and a charge pump 314. The VCO control circuit 370 comprises a judgment unit 330 and an operating frequency controller 340.

Figure 4:
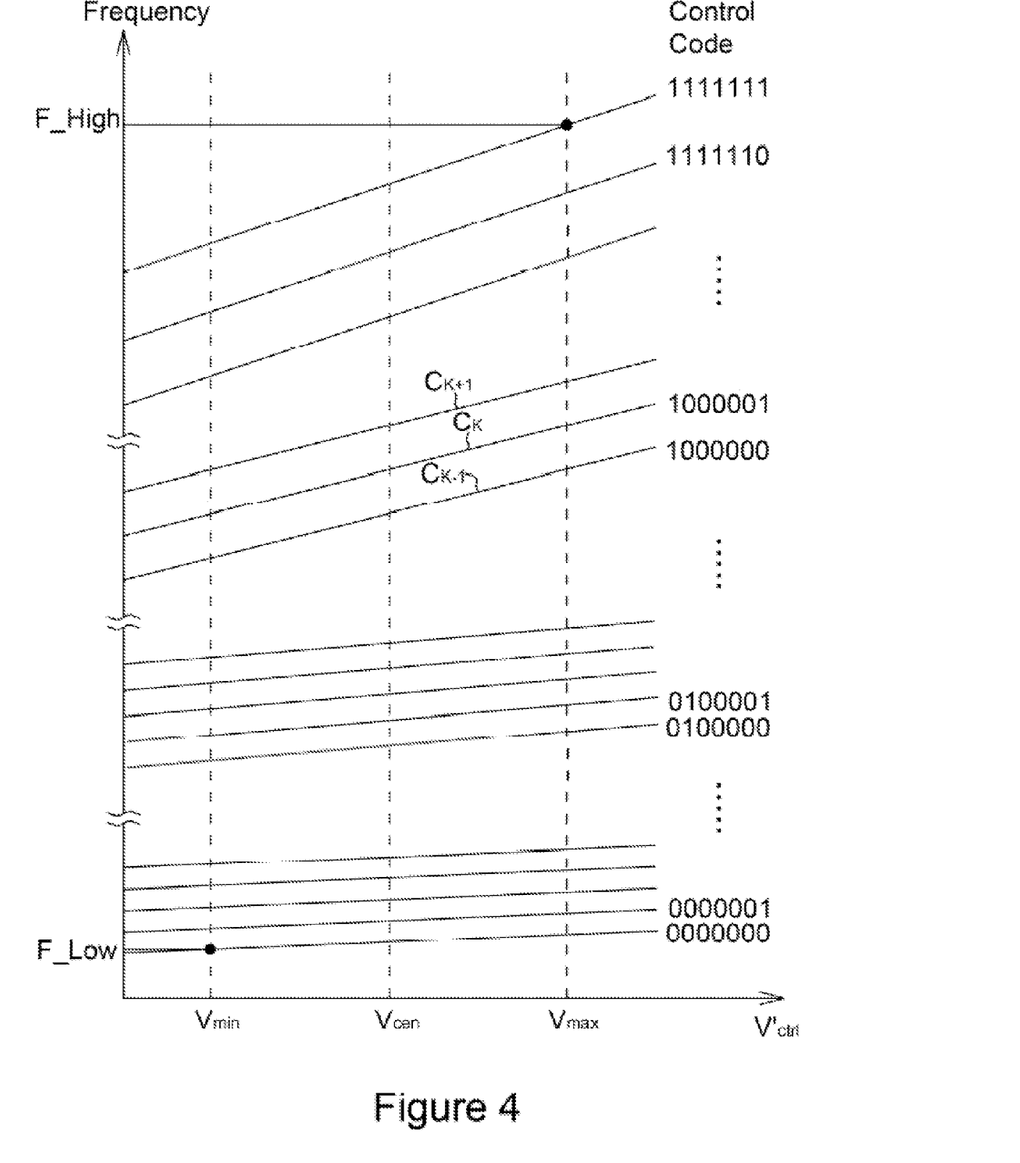
FIG. 4 is a schematic diagram of a plurality of candidate VCO curves of a VCO in accordance with the present disclosure.

The VCO 350 has a plurality of candidate VCO curves shown in FIG. 4, and an output frequency of the VCO 350 is within a range from F_Low to F_High. In addition, the VCO 350 selects a candidate VCO curve as the VCO curve of the VCO 350 according to a control code. For example, when the control code is "1000001", the VCO curve of the VCO 350 is $C_k$; and when the control code is "1000000", the VCO curve of the VCO 350 is $C_{k-1}$. In this embodiment, the VCO 350 has 128 candidate VCO curves, and the control code has 7 bits. In addition, a voltage level of a filtered control signal $V'_{ctrl}$ (to be described below) of the VCO 350 is within a range from 0V to 2V (i.e., $V_{min}$=0V, and $V_{max}$2V).

One of the functions of the PLL 300 is to provide a desired frequency of a clock signal for a transceiver, and a phase of the clock signal (e.g., an output signal $V_{out}$ in FIG. 3) needs to be the same as that of an input signal (e.g., a reference signal $V_{ref}$ in FIG. 3). Therefore, operations of the PLL 300 are divided into two stages—a first stage and a second stage. In the first stage (frequency locking procedure), the VCO curve of the VCO 350 is determined, i.e., frequencies of the reference signal $V_{ref}$ and the output signal $V_{out}$ (or other frequency divided signals) are locked. In other words, in the first stage, when the voltage level of the filtered voltage control signal $V'_{ctrl}$ of the VCO 350 is around a central voltage $V_{cen}$ (e.g., 1V), the frequency of the output signal $V_{out}$ outputted by the VCO 350 is the desired frequency. In the second stage (phase locking procedure), the phase of the output signal $V_{out}$ (or other frequency divided signals) is adjusted to be the same as that of the reference signal $V_{ref}$.

Figure 5:
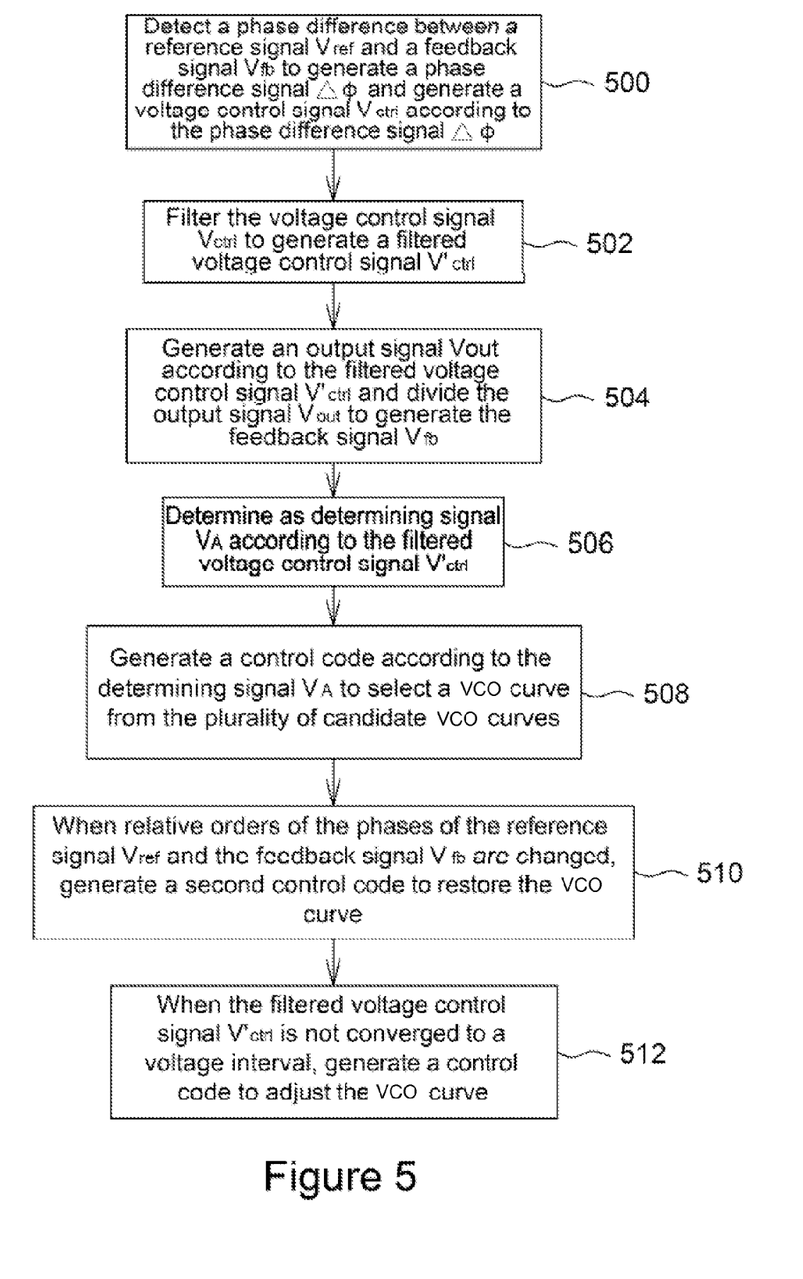
FIG. 5 is a flow chart of a phase locking method in accordance with an embodiment of the present disclosure.

The following description is given with reference to FIG. 3 to FIG. 5. FIG. 5 is a flow chart of a phase locking method in accordance with an embodiment of the present disclosure. It is to be noted that, the flow chart in FIG. 5 illustrates operations of the foregoing second stage (phase locking procedure) of the PLL 300. That is, before the flow in FIG. 5 begins, the frequency is already locked in the first stage (frequency locking procedure), and the VCO 350 operates at a first candidate VCO curve (in the following description of FIG. 5, the VCO curve of the VCO 350 is determined in advance as the candidate VCO curve $C_k$ shown in FIG. 4, i.e., the VCO 350 operates at the VCO curve $C_k$). Then, the PLL 300 generates a frequency locking signal and enters the phase locking phase. The flow of the phase locking method is described below.

In Step 500, after receiving the frequency locking signal, the phase detector 312 detects a phase difference between a reference signal $V_{ref}$ and a feedback signal $V_{fb}$ to generate a phase difference signal Ψ, and the charge pump 314 generates a voltage control signal ψ, according to the phase difference signal LP. In Step 502, the low-pass filter 320 filters the voltage control signal $V_{ctrl}$ to generate a filtered voltage control signal $V'_{ctrl}$. In Step 504, the VCO 350 generates an output signal $V_{out}$ according to the filtered voltage control signal $V'_{ctrl}$, and the frequency divider 360 frequency divides the output signal $V_{out}$ to generate the feedback signal $V_{fb}$.

Figure 6:
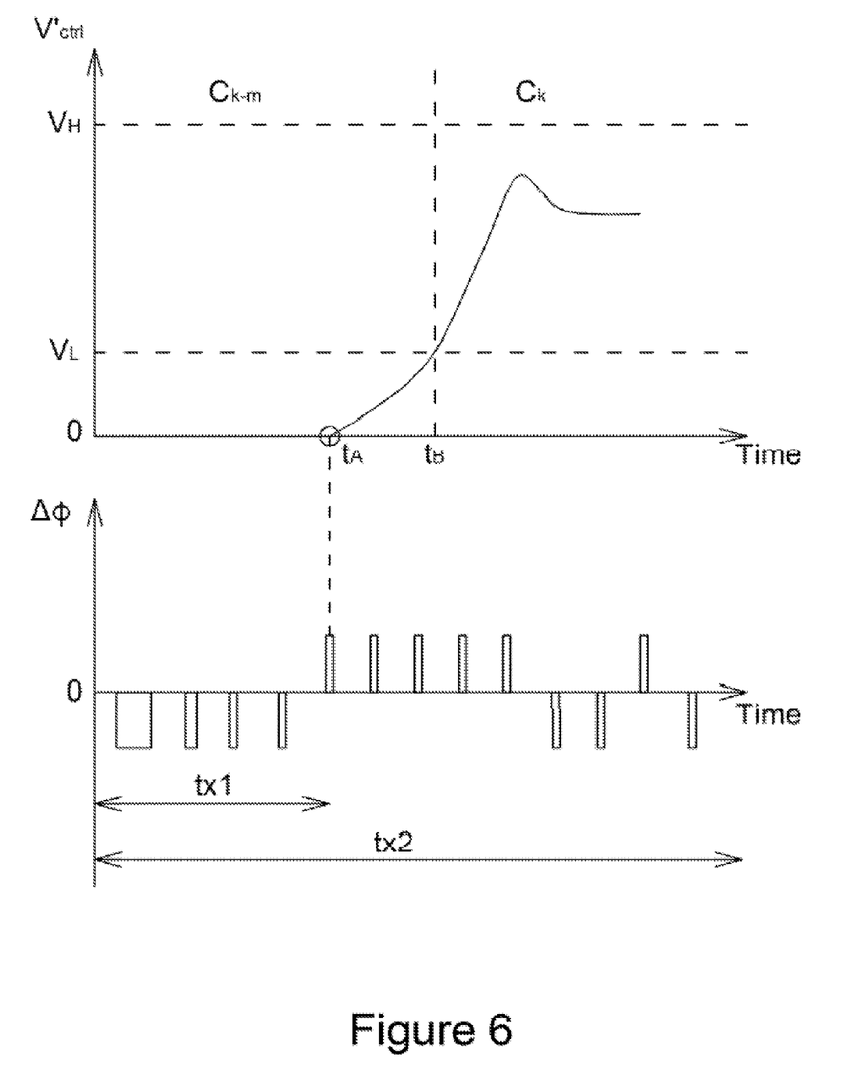
FIG. 6 is a schematic diagram of an operating frequency controller generating a control code to control a VCO curve of a VCO when a judgment unit determines that a voltage level of a filtered control signal is smaller than a threshold in accordance with the present disclosure.

In Step 506, the judgment unit 330 determines as determining signal $V_A$ according to the filtered voltage control signal $V'_{ctrl}$. In Step 508, the operating frequency controller 340 generates a control code according to the determining signal $V_A$ to select a VCO curve of the VCO 350 from the plurality of candidate VCO curves in FIG. 4. Referring to FIG. 6, when the filtered voltage control signal $V'_{ctrl}$ is smaller than a first threshold voltage $V_L$, the operating frequency controller 340 generates a first control code to adjust the VCO curve of the VCO 350 to a candidate VCO $C_{k-m}$, where m is a positive integer. That is, with the same filtered voltage control signal $V'_{ctrl}$, a frequency corresponding to the candidate VCO curve $C_{k-m}$ is smaller than that corresponding to the candidate VCO curve $C_k$.

A significance of adjusting the VCO curve $C_k$ of the VCO 350 to the VCO $C_{k-m}$ is described below. When the filtered voltage control signal $V'_{ctrl}$ is smaller than the first threshold voltage $V_L$, it means that the phase of reference signal $V_{ref}$ lags the phase of the feedback voltage $V_{fb}$ by certain degrees. Therefore, when the VCO curve $C_{k-m}$ is selected as the VCO curve of the VCO 350, the frequency of the output voltage $V_{out}$ (or the feedback voltage $V_{fb}$) is decreased to much lower, such that the phase of the reference signal $V_{ref}$ can quickly reach the phase of the feedback voltage $V_{fb}$ to significantly reduce a time period tx1 in FIG. 6. For example, supposing that a gain of the candidate VCO curve $C_k$ of the VCO 350 and the VCO curve $C_{k-m}$ is 10 MHz/Volt, when the frequency of the reference voltage $V_{ref}$ is 12 MHz and the filtered voltage control voltage $V'_{ctrl}$ is 1V, the frequency of the output signal $V_{out}$ is 3.6 GHz when the VCO curve $C_k$ is selected; and the frequency of the output signal is 3.55 GHz when the VCO curve $C_{k-m}$ is selected, and at this point, the phase of the reference voltage $V_{ref}$ lags M degree to the feedback signal $V_{fb}$, and the time (t=0~t=$t_A$) for the phase of the reference voltage $V_{ref}$ to reach that of the feedback signal $V_{fb}$ is calculated as:

$$tx1=(M/360\ degree)*(360/5)*(1/12\ MHz)=\\ ((M/360\ degree)*6\ \mu s.$$

Therefore, compared to the time (tx1=(M/10)μs) for the phase of the reference voltage $V_{ref}$ to reach that of the feedback signal $V_{fb}$ in the prior art, efficiency of the PLL 300 is significantly increased according to the method provided by the present disclosure.

Figure 7:
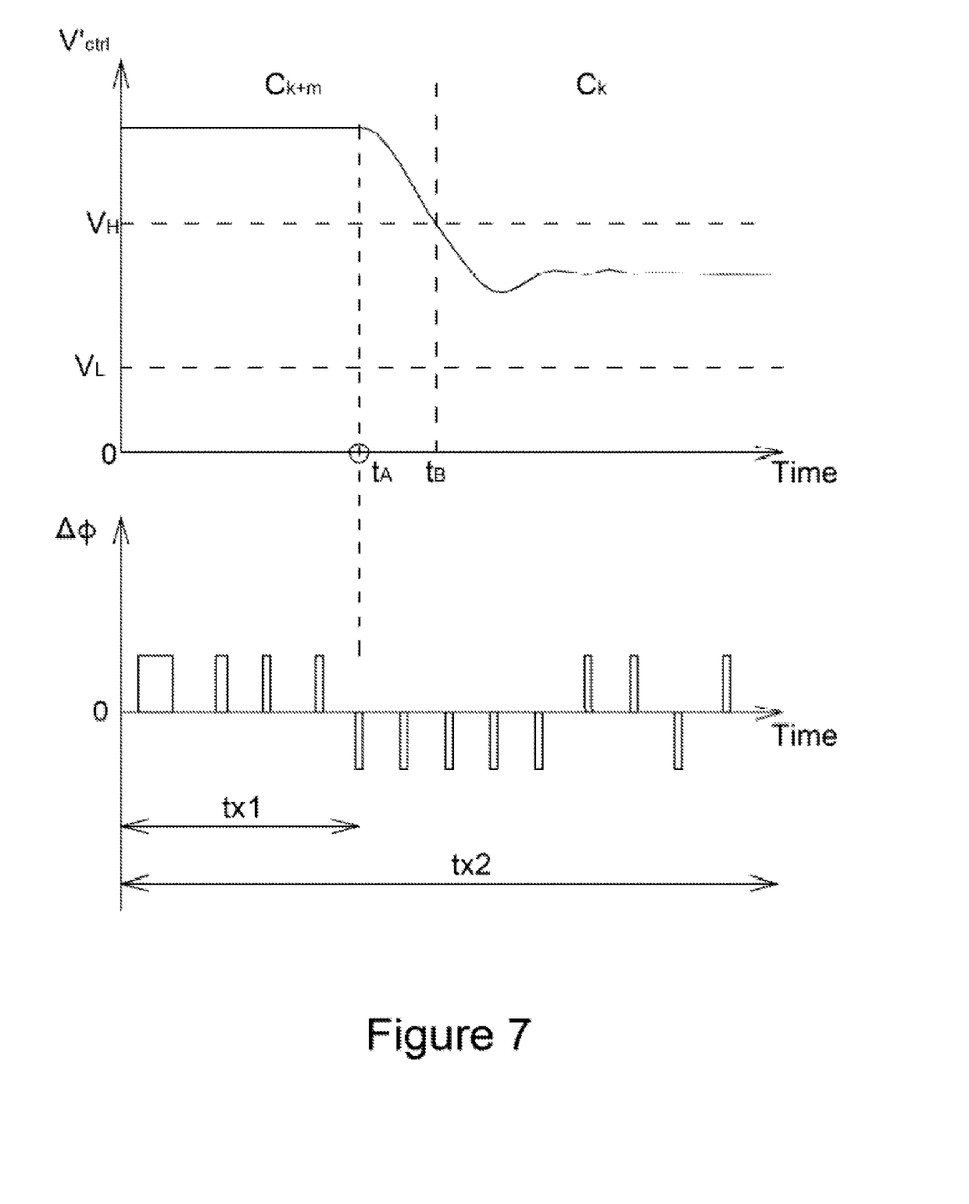
FIG. 7 is a schematic diagram of an operating frequency controller generating a control code to control a VCO curve of a VCO when a judgment unit determines that a voltage level of a filtered control signal is larger than a threshold in accordance with the present disclosure.

Likewise, referring to FIG. 7, when the judgment unit 330 determines that the filtered voltage control signal $V'_{ctrl}$ is greater than a second threshold $V_H$, the operating frequency controller 340 generates a control code to adjust the VCO curve of the VCO 350 to a candidate VCO curve $C_{k+n}$ where n is an positive integer. That is, with the same filtered voltage control signal $V'_{ctrl}$, a frequency corresponding to the candidate VCO curve $C_{k+n}$ is greater than the frequency corresponding to the VCO curve $C_k$.

A significance of adjusting the VCO curve $C_k$ of the VCO 350 to the VCO $C_{k+n}$ is that, when the voltage level of the filtered voltage control signal $V'_{ctrl}$ is greater than the second threshold voltage $V_H$, it means that the phase of reference signal $V_{ref}$ leads the phase of the feedback voltage $V_{fb}$ a lot. Therefore, when the VCO curve $C_{k+n}$ is selected as the VCO curve of the VCO 350, the frequency of the output voltage $V_{out}$ (or the feedback voltage $V_{fb}$) is increased to much higher, such that the phase of the feedback signal $V_{fb}$ can quickly reach the phase of the reference voltage $V_{ref}$ to significantly reduce a time period tx1 in FIG. 7.

In Step 510, when relative orders of the phases of the reference signal $V_{ref}$ and the feedback signal $V_{fb}$ are changed, and the judgment unit 330 determines that the filtered voltage control signal $V'_{ctrl}$ is also changed, the operating frequency controller 340 generates a second control code to adjust the VCO curve of the VCO 350 to the candidate VCO curve $C_k$. For example, supposing that the VCO curve of the VCO is adjusted to the VCO curve $C_{k-m}$ in Step 508, the phase of the reference signal $V_{ref}$ quickly reaches the phase of the feedback signal $V_{fb}$. Accordingly, after the phase of the reference signal $V_{ref}$ leads the phase of the feedback signal $V_{fb}$, when the judgment unit 330 determines that the filtered voltage control signal $V'_{ctrl}$ is greater than the first threshold $V_L$ (e.g., after a time point $t_B$ in FIG. 6 the judgment unit 330 generates a phase locking signal $V_A$, and thus the operating frequency controller 340 generates a second control code to adjust the VCO curve $C_{k-m}$ of the VCO 350 to the VCO curve $C_k$, i.e., the VCO 350 restores to the VCO curve $C_k$. Likewise, when the VCO curve of the VCO is adjusted to the VCO curve $C_{k+n}$ in Step 508, the phase of the feedback signal $V_{fb}$ can quickly reach the phase of the reference signal $V_{ref}$. Accordingly, after the phase of the reference signal $V_{ref}$ becomes behind that of the feedback signal $V_{fb}$, when the judgment unit 330 determines that the voltage level of the filtered voltage control signal $V'_{ctrl}$ is smaller than the second threshold $V_H$ (e.g., after a time point $t_B$ in FIG. 7), the judgment unit 330 generates a phase locking signal $V_A$, and thus the operating frequency controller 340 generates a control code to adjust the VCO curve $C_{k+n}$ of the VCO 350 to the VCO curve $C_k$, i.e., the VCO 350 restores to the VCO curve $C_k$.

In addition, as mentioned above, before the flow in FIG. 5 begins, the VCO curve of the VCO 350 is determined in advance as the VCO curve $C_k$ shown in FIG. 4; however, errors may occur during the process of determining by the PLL 300 the VCO curve of the VCO 350, i.e., the VCO curve $C_k$ may not be a most appropriate VCO curve (which represents a desired frequency outputted by the VCO 350 when the filtered voltage control signal $V'_{ctrl}$ is around the central voltage $V_{cen}$ in FIG. 4). Generally speaking, under such a situation, after spending 30 μs on determining that the VCO $C_k$ is not the most appropriate VCO curve, the PLL 300 re-determines the most appropriate VCO curve, and spends about 30 μs to determine whether the filtered voltage control signal $V'_{ctrl}$ is within in a stable range. Accordingly, the locking time is even further extended, thereby undesirably affecting time allowed for calibration of other components.

The PLL 300 according to the present disclosure is capable of solving the foregoing problem by preventing the significant increase in the locking time due to that the candidate VCO curve $C_k$ determined in advance being not the most appropriate VCO curve.

After the operating frequency controller 340 generates the control code to adjust the VCO curve of the VCO 350 to the candidate VCO curve $C_k$ (in Step 510), theoretically, the filtered voltage control signal $V'_{ctrl}$ is gradually converged (referring to a curve of the filtered voltage control signal $V'_{ctrl}$ after the time point $t_A$ in FIG. 6 and FIG. 7) when the VCO curve $C_k$ is the most appropriate VCO curve. Therefore, after the time point $t_A$ in FIG. 6 and FIG. 7, in the event that the filtered voltage control signal $V'_{ctrl}$ is not converged to a voltage interval, it is determined that errors are present at the beginning of determining the VCO curve of the VCO 350, i.e., the candidate VCO curve $C_k$ is not the most appropriate VCO curve. In Step 512, when the filtered voltage control signal $V'_{ctrl}$ is not converged to a voltage interval, the operating frequency controller 340 generates a control code to adjust the VCO curve of the VCO 350.

Figure 8:
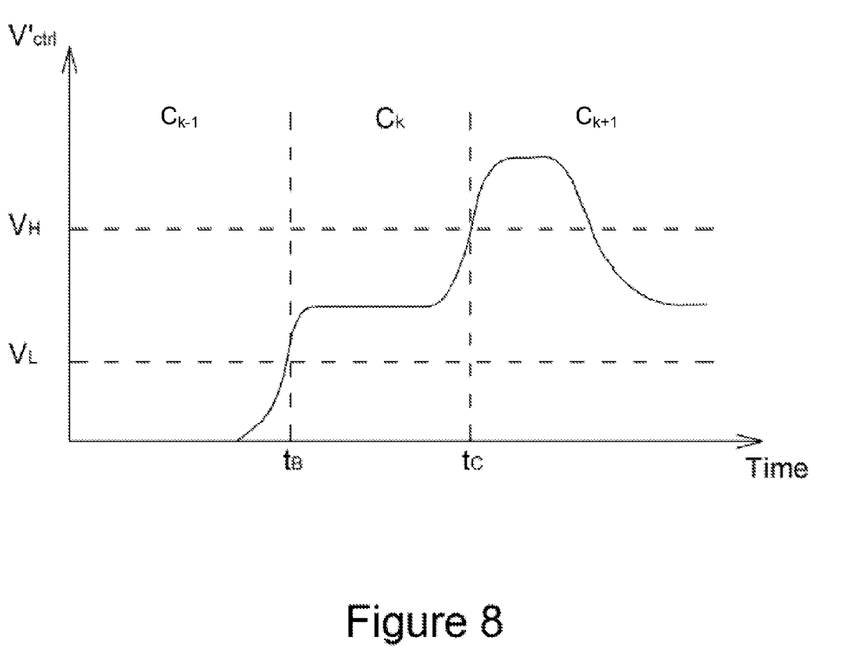
FIG. 8 is a schematic diagram of an operating frequency controller generating a control code to adjust a VCO curve of a VCO when a filtered control voltage is not yet converged in accordance with the present disclosure.

Detailed description of Step 512 is given with reference to FIG. 8. Suppose that the filtered voltage control signal V'ctrl is not converged after the operating frequency controller 340 generates the second control code to adjust the VCO curve of the VCO 350 to the candidate VCO curve Ck (i.e., after a time point tB in FIG. 8). When the judgment unit 330 determines that the filtered voltage control signal V'ctrl continuously increases to being greater than the second threshold voltage VH, it is determined that the candidate VCO curve Ck is not the most appropriate VCO curve. In addition, generally speaking, the candidate VCO curve Ck determined in advance approximates the most appropriate VCO curve, i.e., the most appropriate VCO curve of the VCO 350 may be VCO curves Ck−1, Ck or Ck+1. Therefore, the judgment unit 330 generates a frequency adjustment determining signal to the operating frequency controller 340, which generates a third control code according to the frequency adjustment determining signal to adjust the VCO curve Ck of the VCO 350 to the VCO curve Ck+1 for phase locking operations (after a time point tC).

Figure 9:
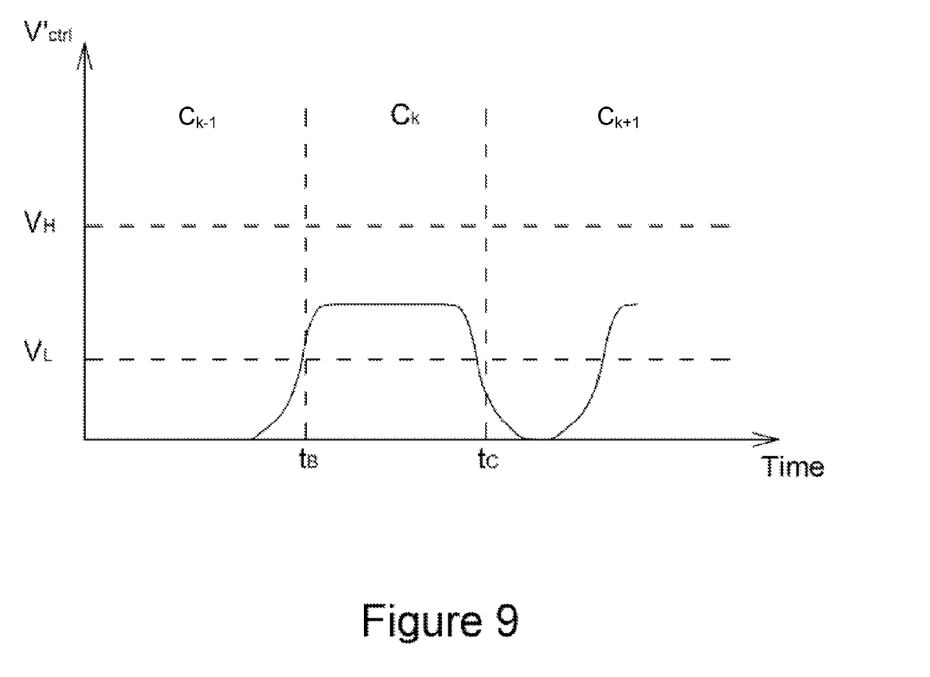
FIG. 9 is a schematic diagram of an operating frequency controller generating a control code to adjust a VCO curve of a VCO when a filtered control voltage is not yet converged in accordance with the present disclosure.

Likewise, referring to FIG. 9, suppose that the filtered voltage control signal V'ctrl is not converged after the operating frequency controller 340 generates the second control code to adjust the VCO curve of the VCO 350 to the candidate VCO curve Ck (i.e., after a time point tB in FIG. 9). When the judgment unit 330 determines that the filtered voltage control signal V'ctrl is smaller than the first threshold voltage VL, it is determined that the candidate VCO curve Ck is not the most appropriate VCO curve. Therefore, the judgment unit 330 generates a frequency adjustment determining signal to the operating frequency controller 340, which generates a fourth control code according to the frequency adjustment determining signal to adjust the VCO curve Ck of the VCO 350 to the VCO curve Ck−1 for phase locking operations (after a time point tC).

It is to be noted that, operation approaches associated with the judgment unit 330 and the operating frequency controller 340 may also be applied to PLLs of other forms, e.g., a full digital PLL, and the VCO 350 in FIG. 3 may also be VCOs (e.g., current-controlled oscillators (CCOs)) for generating desired frequencies. The PLLs and VCOs of different forms are readily apparent to a person having ordinary skills in the art after reading the associated descriptions of FIG. 3 and FIG. 5, and details thereof shall not be described for brevity.

In conclusion, according to a phase locked loop circuit and a phase locking method provided by the present disclosure, a voltage level of a filtered voltage control signal is determined to select a VCO curve of a VCO, and thus not only a speed for locking phases of a reference voltage and a feedback voltage is accelerated, but also the VCO curve of the VCO is calibrated to a most appropriate VCO curve.

While the present disclosure has been described in terms of what is presently considered to be the most practical and preferred embodiments, it is to be understood that the present disclosure needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A voltage-controlled oscillator (VCO) control circuit, applied to a phase locked loop (PLL), for controlling a VCO to process a phase locking procedure after a frequency locking procedure and receiving a frequency locking signal, the VCO control circuit comprising:

a judgment unit, coupled to an input end of the VCO, that generates a phase locking signal according to a voltage control signal inputted to the VCO; and an operating frequency controller, coupled to the VCO and the judgment unit;

wherein, when the VCO control circuit receives the frequency locking signal indicating a frequency is already locked, the operating frequency controller only generates a first control code to control the VCO to switch from a first candidate VCO curve to a second candidate VCO curve to reduce a phase locking time, and when the operating frequency controller receives the phase locking signal, the operating frequency controller only generates a second control code to control the VCO to switch from the second candidate VCO curve back to the first candidate VCO curve, and wherein the first candidate VCO curve is determined in the frequency locking procedure.

2. The VCO control circuit as recited in claim 1, wherein the judgment unit generates the phase locking signal when the judgment unit determines that the voltage control signal is greater than a first threshold voltage.

3. The VCO control circuit as recited in claim 2, wherein an output frequency of the VCO corresponding to the second candidate VCO curve is smaller than an output frequency of the VCO corresponding to the first candidate VCO curve.

4. The VCO control circuit as recited in claim 3, wherein, after the operating frequency controller generates the second control code to control the VCO to switch from the second candidate VCO curve to the first candidate VCO curve, if the judgment unit determines that the voltage control signal is greater than a second threshold voltage, the judgment unit provides a frequency adjustment determining signal to the operating frequency controller to generate a third control code to control the VCO to switch from the first candidate VCO curve to a third candidate VCO curve, the second threshold voltage is larger than the first threshold voltage, and an output frequency of the VCO corresponding to the third candidate VCO curve is larger than the output frequency of the VCO corresponding to the first candidate VCO curve.

5. The VCO control circuit as recited in claim 3, wherein, after the operating frequency controller generates the second control code to control the VCO to switch from the second candidate VCO curve to the first candidate VCO curve, if the judgment unit determines that the voltage control signal is smaller than the first threshold voltage, the judgment unit provides a frequency adjustment determining signal to the operating frequency controller to generate a fourth control code to control the VCO to switch from the first candidate VCO curve to a fourth candidate VCO curve, and an output frequency of the VCO corresponding to the fourth candidate VCO curve is larger than the output frequency of the VCO corresponding to the first candidate VCO curve.

6. A fast locking phase locked loop (PLL) circuit, for accelerating convergence of a phase when a frequency is locked, the fast locking PLL circuit comprising:

a detector, that generates a voltage control signal according to a phase difference between a reference signal and a feedback signal;

a filter, coupled to the detector, that filters the voltage control signal to generate a filtered voltage control signal;

a voltage-controlled oscillator (VCO), coupled to the filter, that generates an output signal according to the filtered voltage control signal;

a frequency divider, coupled to the VCO and the detector, that generates the feedback signal according to the output signal; and a VCO control circuit, coupled to the filter and the VCO;

wherein, when the VCO control circuit receives a frequency locking signal, the VCO control circuit only generates a first control code to control the VCO to switch from a first candidate VCO curve to a second candidate VCO curve to reduce a phase locking time, and when the VCO control circuit determines that the filtered voltage control signal is greater than a first threshold voltage, the VCO control circuit only generates a second control code to control the VCO to switch from the second candidate VCO curve back to the first candidate VCO curve, and wherein the first candidate VCO curve is determined when the frequency is locked.

7. The fast locking PLL circuit as recited in claim 6, wherein the VCO control circuit comprises:

a judgment unit, coupled to the filter, that generates a phase locking signal according to the filtered voltage control signal inputted to the VCO; and an operating frequency controller, coupled to the VCO and the judgment unit, that provides one of the first control code and the second control code to the VCO;

wherein, when the operating frequency controller receives a frequency locking signal, the operating frequency controller generates the first control code to control the VCO to switch from the first candidate VCO curve to the second candidate VCO curve, and when the operating frequency controller receives the phase locking signal, the operating frequency controller generates the second control code to control the VCO to switch from the second candidate VCO curve to the first candidate VCO curve.

8. The fast locking PLL circuit as recited in claim 6, wherein an output frequency of the VCO corresponding to the second candidate VCO curve is smaller than an output frequency of the VCO corresponding to the first candidate VCO curve.

9. The fast locking PLL circuit as recited in claim 8, wherein, after the operating frequency controller generates the second control code to control the VCO to switch from the second candidate VCO curve to the first candidate VCO curve, if the judgment unit determines that the voltage control signal is greater than a second threshold voltage, the judgment unit provides a frequency adjustment determining signal to the operating frequency controller to generate a third control code to control the VCO to switch from the first candidate VCO curve to a third candidate VCO curve, the second threshold voltage is larger than the first threshold voltage, and an output frequency of the VCO corresponding to the third candidate VCO curve is larger than the output frequency of the VCO corresponding to the first candidate VCO curve.

10. The fast locking PLL circuit as recited in claim 8, wherein, after the operating frequency controller generates the second control code to control the VCO to switch from the second candidate VCO curve to the first candidate VCO curve, if the judgment unit determines that the voltage control signal is smaller than the first threshold voltage, the judgment unit provides a frequency adjustment determining signal to the operating frequency controller to generate a fourth control code to control the VCO to switch from the first candidate VCO curve to a fourth candidate VCO curve, and an output frequency of the VCO corresponding to the fourth candidate VCO curve is larger than the output frequency of the VCO corresponding to the first candidate VCO curve.

11. A voltage-controlled oscillator (VCO) control method, applied to a phase locked loop (PLL), for controlling a VCO to process a phase locking procedure after a frequency locking procedure and receiving a frequency locking signal, the VCO control method comprising:

generating only a first control code to control the VCO to switch from a first candidate VCO curve to a second candidate VCO curve to reduce a phase locking time when the frequency locking signal is received; and generating only a second control code to control the VCO to switch from the second candidate VCO curve back to the first candidate VCO curve when a voltage control signal inputted by the VCO is larger than a first threshold voltage, wherein the first candidate VCO curve is determined when the frequency is locked.

12. The control method as recited in claim 11, wherein an output frequency of the VCO corresponding to the second candidate VCO curve is smaller than an output frequency of the VCO corresponding to the first candidate VCO curve.

13. The VCO control method as recited in claim 12, wherein, after the second control code is generated to control the VCO to switch from the second candidate VCO curve to the first candidate VCO curve, if the voltage control signal is greater than a second threshold voltage, the method further comprises providing a frequency adjustment determining signal to an operating frequency controller to generate a third control code to control the VCO to switch from the first candidate VCO curve to a third candidate VCO curve, the second threshold voltage is larger than the first threshold voltage, and an output frequency of the VCO corresponding to the third candidate VCO curve is larger than the output frequency of the VCO corresponding to the first candidate VCO curve.

14. The VCO control method as recited in claim 12, wherein, after the second control code is generated to control the VCO to switch from the second candidate VCO curve to the first candidate VCO curve, if the voltage control signal is smaller than the first threshold voltage, the method further comprises providing an adjustment signal to an operating frequency controller to generate a fourth control code to control the VCO to switch from the first candidate VCO curve to a fourth candidate VCO curve, and an output frequency of the VCO corresponding to the fourth candidate VCO curve is larger than the output frequency of the VCO corresponding to the first candidate VCO curve.

* * * * *